US009910092B2

(12) United States Patent
Park et al.

(10) Patent No.: US 9,910,092 B2
(45) Date of Patent: Mar. 6, 2018

(54) SWITCH DETERIORATION DETECTION DEVICE AND METHOD

(71) Applicant: LG CHEM, LTD., Seoul (KR)

(72) Inventors: Jaedong Park, Daejeon (KR); Sang Hoon Lee, Daejeon (KR); Younghwan Kim, Daejeon (KR); Chang Hyun Sung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/308,470

(22) PCT Filed: Jul. 29, 2015

(86) PCT No.: PCT/KR2015/007910
§ 371 (c)(1),
(2) Date: Nov. 2, 2016

(87) PCT Pub. No.: WO2016/156740
PCT Pub. Date: Apr. 14, 2016

(65) Prior Publication Data
US 2017/0059657 A1 Mar. 2, 2017

(30) Foreign Application Priority Data
Oct. 6, 2014 (KR) ........................ 10-2014-0134373

(51) Int. Cl.
*G01R 31/327* (2006.01)
(52) U.S. Cl.
CPC ....... *G01R 31/327* (2013.01); *G01R 31/3277* (2013.01)
(58) Field of Classification Search
CPC . B60T 7/042; H01M 10/4285; G01R 31/3277
See application file for complete search history.

(56) References Cited

U.S. PATENT DOCUMENTS 6,353,522 B1 3/2002 Akahane
2009/0179026 A1 7/2009 Morita et al.
(Continued)

FOREIGN PATENT DOCUMENTS

JP 2002-252901 A 9/2002
JP 2005-102471 A 4/2005
(Continued)

OTHER PUBLICATIONS

International Search Report, issued in PCT/KR2015/007910 (PCT/ISA/210), dated Nov. 11, 2015.
(Continued)

*Primary Examiner* — Jermele M Hollington
*Assistant Examiner* — Alvaro Fortich
(74) *Attorney, Agent, or Firm* — Birch, Stewart, Kolasch & Birch, LLP

(57) ABSTRACT

Provided are switch deterioration detection device and method. More particularly, the switch deterioration detection device includes: a resistor serially connected with a battery in which charge and discharge are controlled through a switch; a first differential amplifier configured to amplify a voltage difference between both ends of the switch to output the amplified voltage difference as a first output voltage; a second differential amplifier configured to amplify a voltage difference between both ends of the resistor to output the amplified voltage difference as a second output voltage; a comparator configured to compare levels between the second and second output voltages; and a controller configured to determine whether the switch deteriorates based on the compared result of the comparator.

14 Claims, 5 Drawing Sheets

(56) References Cited

U.S. PATENT DOCUMENTS

| | | | | |
|---|---|---|---|---|
| 2013/0019651 A1* | 1/2013 | Sasaki | ............... | F02D 41/222 73/1.02 |
| 2013/0099740 A1* | 4/2013 | Takashima | .......... | B60L 11/1816 320/109 |
| 2014/0244099 A1* | 8/2014 | Kakinuma | ........... | G07C 5/0808 701/31.4 |

FOREIGN PATENT DOCUMENTS

| | | |
|---|---|---|
| JP | 2006-304406 A | 11/2006 |
| JP | 2009-191842 A | 8/2009 |
| JP | 2013-142561 A | 7/2013 |

OTHER PUBLICATIONS

Korean Office Action for application No. 10-2014-0134373 dated Feb. 23, 2016.

\* cited by examiner

[Figure 1]
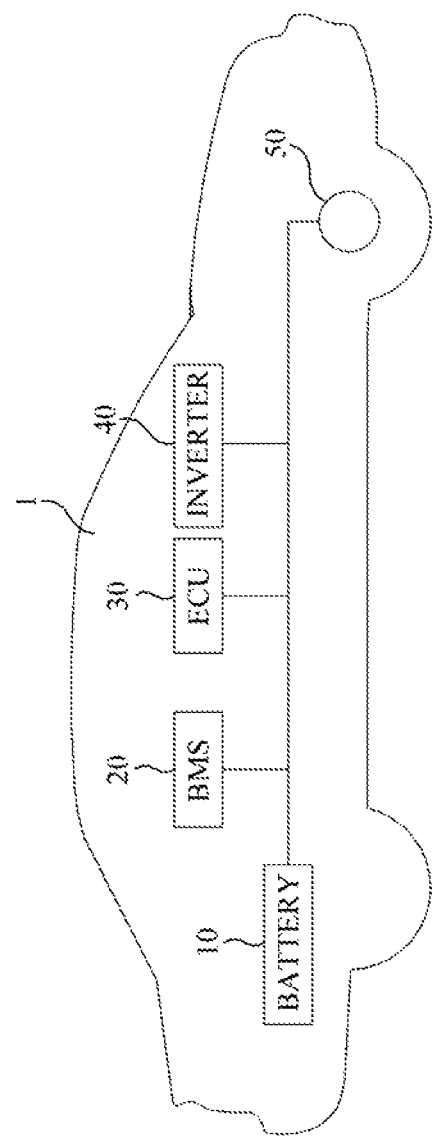

[Figure 2]
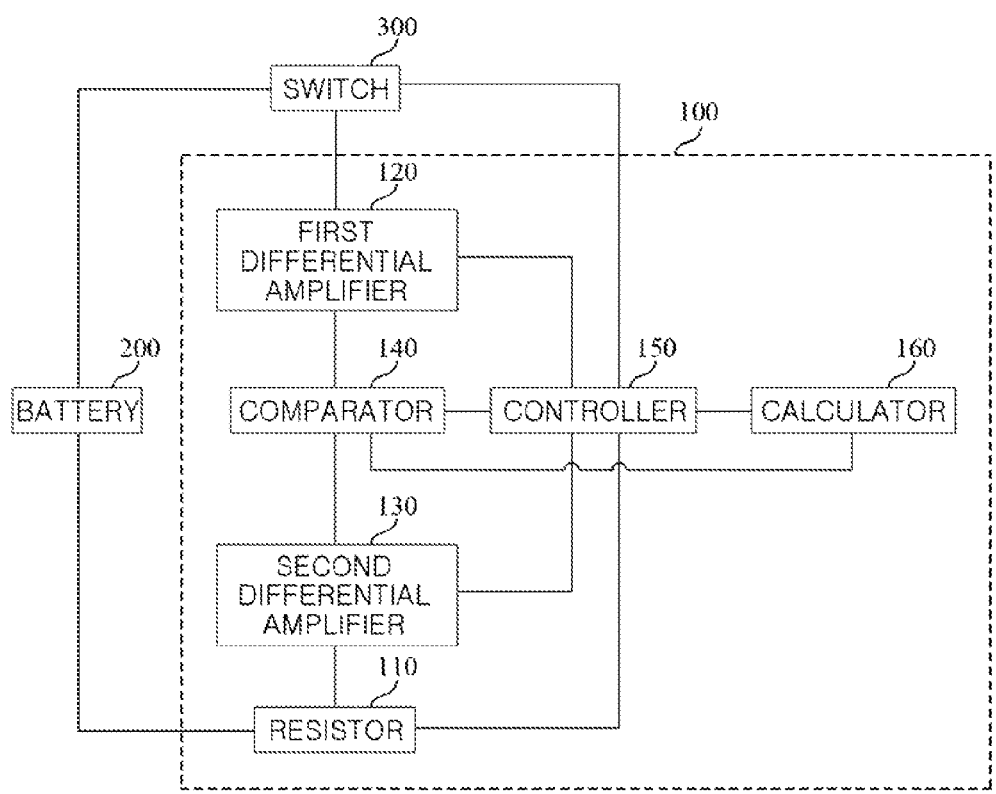

[Figure 3]
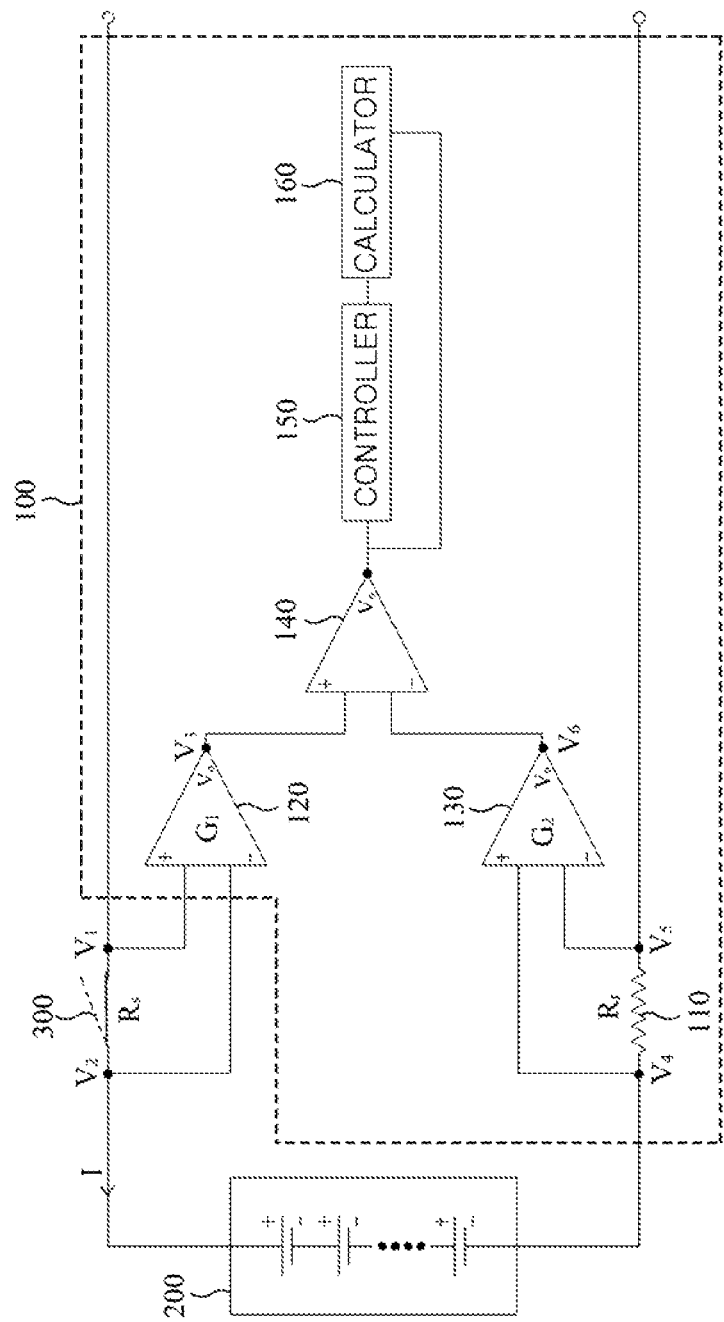

[Figure 4]
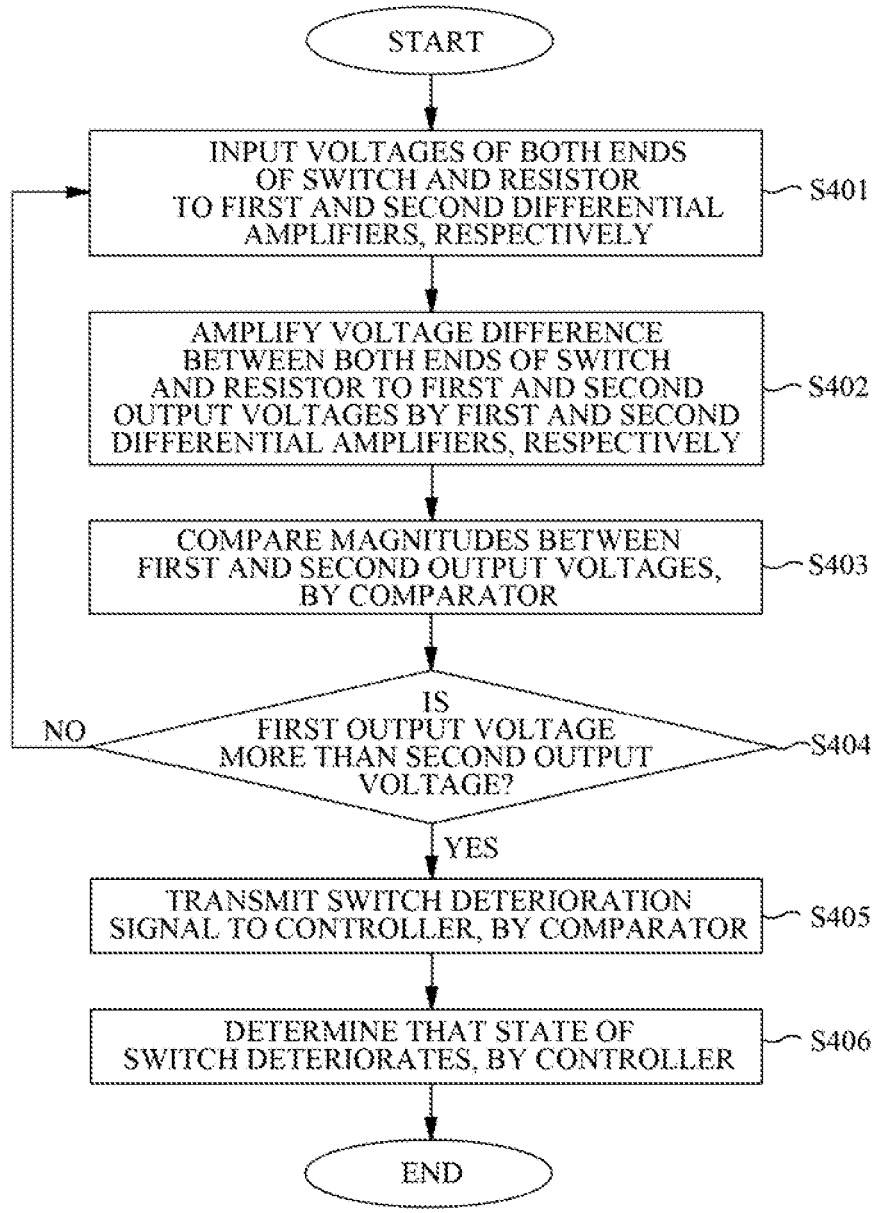

[Figure 5]
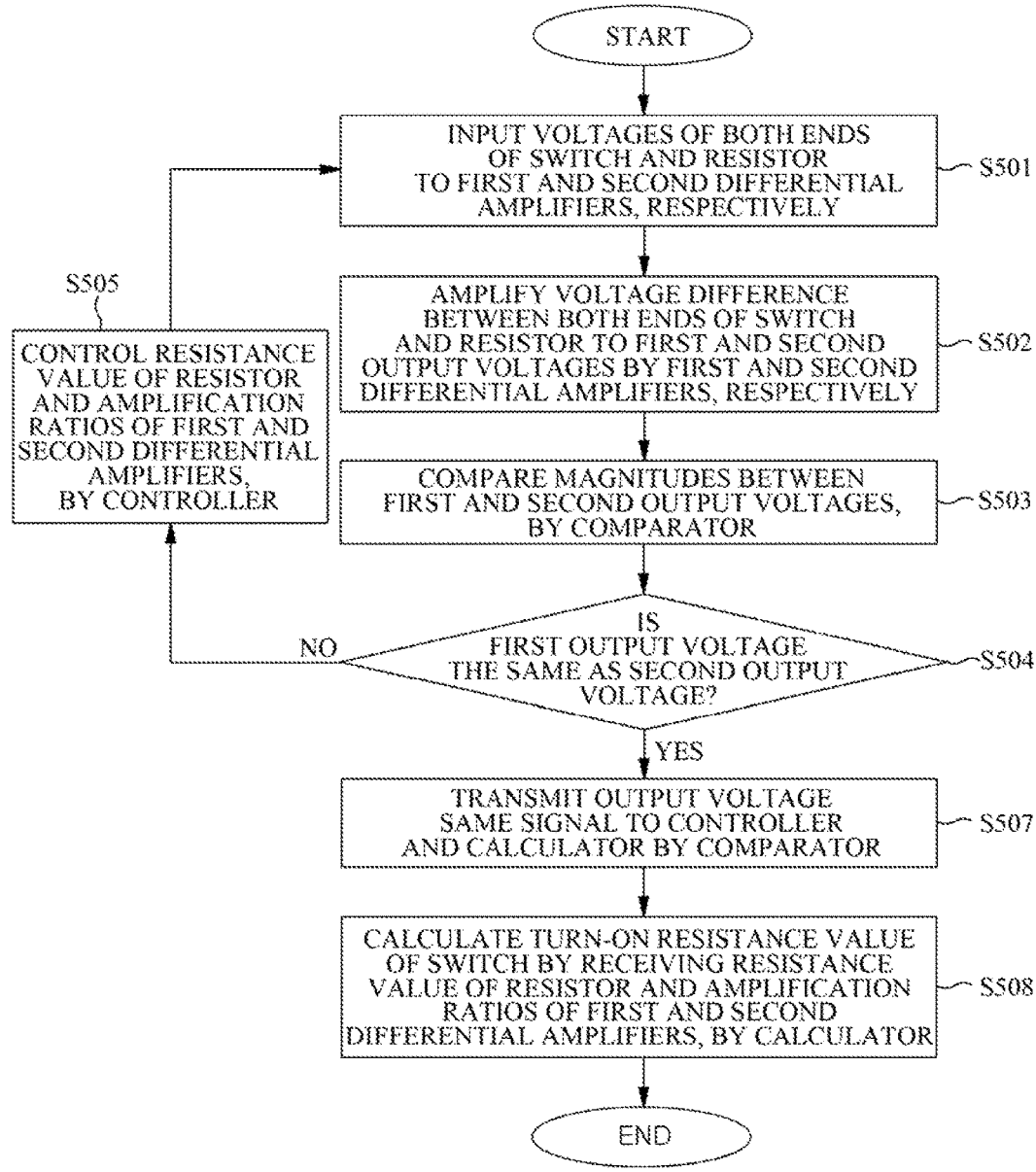

SWITCH DETERIORATION DETECTION DEVICE AND METHOD

TECHNICAL FIELD

The present application claims priority to Korean Patent Application No. 10-2014-0134373, filed in the Korean Intellectual Property Office on Oct. 6, 2014, with the Korean Patent Office, the entire contents of which are incorporated herein by reference.

The present invention relates to switch deterioration detection device and method, and more particularly, to switch deterioration detection device and method which include a resistor serially connected to a battery of which charge and discharge are controlled by a switch and compare an output voltage amplifying a voltage difference between both ends of the switch and an output voltage amplifying a voltage difference between both ends of the resistor by a comparator to detect deterioration of the switch. Further, the present invention relates to switch deterioration detection device and method which control at least one of a resistance value of the resistor, an amplification ratio of a differential amplifier amplifying a voltage difference between both ends of the switch, and an amplification ratio of a differential amplifier amplifying a voltage difference between both ends of the resistor so that output voltages of the differential amplifiers are the same as each other and calculate a turn-on resistance value of the switch by using the resistance value of the resistor and the amplification ratio of the differential amplifier at the time when the output voltages are the same as each other.

BACKGROUND ART

Recently, due to depletion of fossil energy and environmental pollution caused by using fossil energy, interest in electrical products capable of being driven by using a secondary battery has increased. As a result, as technical development and demand for a mobile device, an electric vehicle (EV), a hybrid vehicle (HV), an energy storage system (ESS), an uninterruptible power supply (UPS), and the like, demand of the secondary battery as an energy source has been rapidly increased.

The secondary batteries have received attention as a new energy source for environment-friendly and improvement of energy efficiency in that no by-product is generated depending on use of energy in addition to a primary advantage of remarkably reducing use of fossil energy. Particularly, the second battery which is used for the EV, the HV, the ESS, or the UPS uses a battery pack in which a plurality of battery modules is connected to each other as a power source in order to charge or discharge high-output and large-capacity power.

As such, in the battery pack in which the high-output and large-capacity power is frequently charged or discharged, various switch elements such as an on/off switch for controlling charge and discharge of the battery pack and a relay switch for protecting the battery pack from overcharging, over-discharging, and a surge current are installed to control and protect the battery pack.

In the switch element installed in the battery pack, due to deterioration in which physical performance deteriorates by operating the battery pack, a turn-on resistance value of the switch element is increased and thus a control function and a protection function of the battery pack of the switch element are lost by accelerating the deterioration of the switch element.

Accordingly, when the battery pack operates, it is important to detect the deterioration of the switch element installed in the battery pack and it is very important to exactly calculate the turn-on resistance of the switch element in order to more exactly detect the deterioration of the switch element.

A technique of detecting the deterioration of the switch element installed on the battery pack in the related art monitors a temperature of the switch element through a temperature sensor at all times to compare a measured temperature and a reference temperature by a comparing apparatus and determines that the switch deteriorates when the measured temperature of the switch element is more than the reference temperature. However, the temperature of the switch element, as a temperature influenced by an internal temperature of a housing in which a plurality of switches, a protection circuit, a control module, and the like are received, is a temperature which is changed according to a temperature of a switch surface, that is, a periphery environment of the switch, not a temperature of the switch itself.

Accordingly, since the technique of detecting the deterioration of the switch element by measuring the temperature of the switch element uses the temperature influenced by the ambient environment of the switch, reliability and precision of the detected result deteriorate.

As a result, in order to solve the aforementioned problems in the related art, the inventors of the present invention invented switch deterioration detection device and method, which include a resistor which is serially connected with a battery of which charge and discharge are controlled by switch, compare an output voltage amplifying a voltage difference between both ends of the switch and an output voltage amplifying a voltage difference between both ends of the resistor, by the comparator to detect deterioration of the switch, and control at least one of a resistance value of the resistor, an amplification ratio of a differential amplifier amplifying a voltage difference between both ends of the switch, and an amplification ratio of a differential amplifier amplifying a voltage difference between both ends of the resistor so that output voltages of the differential amplifiers are the same as each other and calculate a turn-on resistance value of the switch by using the resistance value of the resistor and the amplification ratio of the differential amplifier at the time when the output voltages are the same as each other.

DETAILED DESCRIPTION OF THE INVENTION

Technical Problem

In order to solve the aforementioned problems in the related art, an object of the present invention is to provide switch deterioration detection device and method which can provide an exact detected result with improved reliability and precision for the deterioration detecting result of the switch by comparing an output voltage amplifying a voltage difference between both ends of a resistor which is serially connected with a battery with an output voltage amplifying a voltage difference between both ends of the switch controlling charge and discharge of the battery through a comparator by detecting deterioration of the switch based on the compared result of the comparator.

Further, another object of the present invention is to provide switch deterioration detection device and method which can control at least one of a resistance value of the resistor, an amplification ratio of a differential amplifier amplifying a voltage difference between both ends of the switch, and an amplification ratio of a differential amplifier amplifying a voltage difference between both ends of the resistor so that output voltages of the differential amplifiers are the same as each other and calculate a turn-on resistance value of the switch by using the resistance value of the resistor and the amplification ratio of the differential amplifier at the time when the output voltages are the same as each other.

Technical Solution

An exemplary embodiment of the present invention provides a switch deterioration detection device including: a resistor serially connected with a battery in which charge and discharge are controlled by a switch; a first differential amplifier configured to amplify a voltage difference between both ends of the switch to output the amplified voltage difference as a first output voltage; a second differential amplifier configured to amplify a voltage difference between both ends of the resistor to output the amplified voltage difference as a second output voltage; a comparator configured to compare levels between the second and second output voltages; and a controller configured to determine whether the switch deteriorates based on the compared result of the comparator.

The comparator may output a switch deterioration signal when the first output voltage is more than the second output voltage as a result of comparing the levels between the first and second output voltages.

The controller may determine that the switch deteriorates when receiving the switch deterioration signal. The comparator may output an output voltage same signal when the first output voltage is the same as the second output voltage as a result of comparing the levels between the first and second output voltages.

The controller may control at least one of a resistance value of the resistor and amplification ratios of the first and second differential amplifiers so that the output voltage same signal is output from the comparator.

The switch deterioration detection device may further include a calculator configured to calculate a turn-on resistance value of the switch by using the resistance value of the resistor and the amplification ratios of the first and second differential amplifiers when the output voltage same signal is output from the comparator.

The calculator may calculate the turn-on resistance value of the switch by using the following Equation.

$$R_s = \frac{R_r \times G_2}{G_1} \quad \text{[Equation]}$$

Here, $R_s$=turn-on resistance value of switch,
$R_r$=resistance value of resistor,
$G_1$=amplification ratio of first differential amplifier when the comparator outputs the output voltage same signal, and
$G_2$=amplification ratio of second differential amplifier when the comparator outputs the output voltage same signal.

Another exemplary embodiment of the present invention provides a switch deterioration detection method including: providing a resistor which is serially connected with a battery in which charge and discharge are controlled by a switch; amplifying a voltage difference between both ends of the switch to output the amplified voltage difference as a first output voltage, by a first differential amplifier; amplifying a voltage difference between both ends of the resistor to output the amplified voltage difference as a second output voltage, by a second differential amplifier; comparing levels between the first and second output voltages, by a comparator; and determining whether the switch deteriorates based on the compared result of the comparator, by a controller.

The switch deterioration detection method may further include outputting a switch deterioration signal when the first output voltage is more than the second output voltage as a result of comparing the levels between the first and second output voltages, by the comparator.

The switch deterioration detection method may further include determining that the switch deteriorates when the controller receives the switch deterioration signal.

The switch deterioration detection method may further include outputting an output voltage same signal when the first output voltage is the same as the second output voltage as a result of comparing the levels between the first and second output voltages, by the comparator.

The switch deterioration detection method may further include controlling at least one of a resistance value of the resistor and amplification ratios of the first and second differential amplifiers, by the controller so that the output voltage same signal is output from the comparator.

The switch deterioration detection method may further include calculating a turn-on resistance value of the switch by using a resistance value of the resistor and amplification ratios of the first and second differential amplifiers when the calculator receives the output voltage same signal from the comparator.

The calculator may calculate the turn-on resistance value of the switch by using the following Equation.

$$R_s = \frac{R_r \times G_2}{G_1} \quad \text{[Equation]}$$

Here, $R_s$=turn-on resistance value of switch,
$R_r$=resistance value of resistor,
$G_1$=amplification ratio of first differential amplifier when the comparator outputs the output voltage same signal, and
$G_2$=amplification ratio of second differential amplifier when the comparator outputs the output voltage same signal.

Advantageous Effects

The switch deterioration detection device and method according to the exemplary embodiment of the present invention have advantages of providing an exact detected result with improved reliability and precision for the deterioration detecting result of the switch by amplifying and comparing a voltage difference between both ends of the switch and a voltage difference between both ends of a resistor which is serially connected with a battery to detect deterioration of the switch without detecting the deterioration of the switch by using a temperature of the switch influenced by an ambient temperature of the switch.

Further, the present invention has advantages of controlling at least one of a resistance value of the resistor and amplification ratios of the differential amplifiers so that output voltages of the differential amplifiers are the same as each other and exactly calculating a turn-on resistance value of the switch by using only the resistance value of the resistor which is serially connected with the battery and the amplification ratios of the differential amplifiers at the time when the output voltages are the same as each other, without calculating the turn-on resistance value of the switch by using a voltage and a current of the switch which are measured by synchronizing a measurement timing.

Further, the present invention has advantages of preventing damage and fire of a battery system due to overheating of the switch by providing the exact switch deterioration detected result and the turn-on resistance value of the switch.

BRIEF DESCRIPTION OF DRAWINGS

FIG. 1 is a diagram schematically illustrating an electric vehicle to which a switch deterioration detection device according to an exemplary embodiment of the present invention is applied.

FIG. 2 is a block diagram illustrating a configuration of the switch deterioration detection device according to the exemplary embodiment of the present invention.

FIG. 3 is a diagram illustrating an example of a detailed configuration of the switch deterioration detection device according to the exemplary embodiment of the present invention.

FIG. 4 is a flowchart illustrating a sequence of determining deterioration of a switch by the switch deterioration detection device according to the exemplary embodiment of the present invention.

FIG. 5 is a flowchart illustrating a sequence of calculating a turn-on resistance value of the switch by the switch deterioration detection device according to the exemplary embodiment of the present invention.

BEST MODE

Hereinafter, the present invention will be described in detail with reference to the accompanying drawings. Herein, the detailed description of a known function and configuration that may make the purpose of the present invention unnecessarily ambiguous in describing the spirit of the present invention will be omitted. Exemplary embodiments of the present invention are provided so that those skilled in the art may more completely understand the present invention. Accordingly, the shape, the size, etc., of elements in the figures may be exaggerated for explicit comprehension.

In addition, unless explicitly described to the contrary, the word "comprise" and variations such as "comprises" or "comprising", will be understood to imply the inclusion of stated elements but not the exclusion of any other elements.

In addition, the terms "-unit" described in the specification mean units for processing at least one function and operation and can be implemented by hardware components or software components and combinations thereof.

FIG. 1 is a diagram schematically illustrating an electric vehicle to which a switch deterioration detection device according to an exemplary embodiment of the present invention is applied.

In FIG. 1, an example in which the switch deterioration detection device according to an exemplary embodiment of the present invention is applied to an electric vehicle is illustrated, but the switch deterioration detection device according to the exemplary embodiment of the present invention may be applied to any technical field such as a mobile device, an energy storage system, or an uninterruptible power supply device in addition to the electric vehicle so long as secondary batteries may be applied.

An electric vehicle 1 may be configured to include a battery 10, a battery management system (BMS) 20, an electronic control unit (ECU) 30, an inverter 40, and a motor 50.

The battery 10 is an electric energy source that drives the electric vehicle 1 by providing drive force to the motor 50. The battery 10 may be charged or discharged by the inverter 40 depending on driving of the motor 50 or an internal combustion engine (not illustrated).

Herein, the type of battery 10 is not particularly limited and may be constituted by, for example, a lithium ion battery, a lithium polymer battery, a nickel cadmium battery, a nickel hydrogen battery, a nickel zinc battery, and the like.

The BMS 20 estimates a state of the battery 10 and manages the battery 10 by using the estimated state information. For example, the BMS 20 estimates and manages the state information of the battery 10, which includes a state of charging (SOC), a state of health (SOH), a maximum input/output power permission amount, an output voltage, and the like of the battery 10. In addition, the BMS 20 controls the charging or discharging of the battery 10 by using the state information and furthermore, may estimate an exchange time of the battery 10.

Further, the BMS 20 may include a switch deterioration detection device 100 (see FIG. 2) to be described below. The battery 10 may be prevented from being damaged by detecting deterioration of a switch (not illustrated) connected to the battery 10 by the switch deterioration detection device 100.

The ECU 30 is an electronic control apparatus that controls a state of the electric vehicle 1. For example, the ECU 30 determines a torque degree based on information including an accelerator, a brake, a speed, and the like and controls an output of the motor 50 to be suitable for torque information.

Further, the ECU 30 transmits a control signal to the inverter 40 so as to charge or discharge the battery 10 based on the state information including the SOC, SOH, and the like of the battery 10 received by the BMS 20. The inverter 40 allows the battery 10 to be charged or discharged based on the control signal of the ECU 30.

The motor 50 drives the electric vehicle 1 based on control information (for example, torque information) received from the ECU 30 by using electric energy of the battery 10.

FIG. 2 is a block diagram illustrating a configuration of the switch deterioration detection device according to the exemplary embodiment of the present invention and FIG. 3 is a diagram illustrating an example of a detailed configuration of the switch deterioration detection device according to the exemplary embodiment of the present invention.

Referring to FIGS. 2 and 3, the switch deterioration detection device 100 may be configured to include a resistor 110, a first differential amplifier 120, a second differential amplifier 130, a comparator 140, a controller 150, and a calculator 160. The switch deterioration detection device 100 illustrated in FIGS. 2 and 3 follows the exemplary embodiment, and constituent elements are not limited to the exemplary embodiment illustrated in FIGS. 2 and 3 and may be added, modified, or deleted if necessary.

The resistor 110 is serially connected to the battery 200 and may be a resistive element having a predetermined resistance value. Here, the predetermined resistance value may be a threshold value of a turn-on resistance value $R_s$ of the switch 300 controlled through the controller 150 to be described below, in order to detect the deterioration of the switch 300 to be described below and calculate the turn-on resistance value $R_s$ of the switch 300. For example, the predetermined resistance value may be 1 mΩ which is the threshold value of the turn-on resistance value $R_s$ of the switch 300.

In one exemplary embodiment, the resistor 110 may be included in a current sensor for monitoring a current flowing in the battery 200 when power is charged or discharged in the battery 200, and for example, the resistor 110 may be an a variable resistor or a shunt resistor in which the resistance value is varied.

Meanwhile, in the exemplary embodiment, it is illustrated that the resistor 110 is connected to a cathode of the battery 200, but it is noted that a position of the resistor 110 connected with the battery 200 is not limited.

A kind of battery 200 described above is not particularly limited, but the battery 200 may be a secondary battery which is used in an electric vehicle, a hybrid vehicle, an energy storage system, and an uninterruptible power supply device, and the like, and for example, may be configured by a lithium-ion battery, a lithium polymer battery, a nickel cadmium battery, a nickel hydrogen battery, a nickel zinc battery, or the like.

The switch 300 is connected to the battery 200 and thus, the current flowing into the battery 200 is conducted or interrupted. A kind of switch 300 is also not particularly limited, but the switch 200 may be an on/off switch for controlling charging and discharging of the battery 200, a fled effect transistor (FET) switch, or a relay switch for protecting the battery 200 against overcharging, over-discharge, and surge current.

Meanwhile, in the exemplary embodiment, it is illustrated that the switch 300 is connected to an anode of the battery 200, but it is noted that a position of the switch 300 connected with the battery 200 is not limited.

The first differential amplifier 120 may include a first inversion terminal (−), a first non-inversion terminal (+), a first output terminal $V_o$, and a variable resistor (not illustrated). The first differential amplifier 120 may serve to receive voltages $V_1$ and $V_2$ of both ends of the switch 300 to the first inversion terminal (−) and the first non-inversion terminal (+), respectively, when the switch 300 is turned on and thus an operation state is an on state and output a first output voltage $V_3$ to the first output terminal $V_o$ by amplifying a voltage difference $V_1$-$V_2$ of the both ends of the switch 300.

In more detail, the first non-inversion terminal (+) is connected with a high voltage terminal $V_1$ of the both ends of the switch 300, and the first inversion terminal (−) is connected to a low voltage terminal $V_2$ of both ends of the switch 300 to receive the voltages $V_1$ and $V_2$ applied to both ends of the switch 300.

Sequentially, the first differential amplifier 120 may output the first output voltage $V_3$ to the first output terminal $V_o$ by amplifying the voltage difference $V_1$-$V_2$ of the voltages $V_1$ and $V_2$ applied to both ends of the switch 300 inputted to the first inversion terminal (−) and the first non-inversion terminal (+) by a predetermined amplification ratio $G_1$.

Here, the predetermined amplification ratio $G_1$ is a value controlled by the controller 150 to be described below as a value which varies according to a resistance value of a variable resistor included in the first differential amplifier 120.

The first output voltage $V_3$ amplified through the aforementioned first differential amplifier 120 and outputted to the first output terminal $V_o$ is as the following Equation 1.

$$V_3 = G_1(V_1 - V_2) \quad \text{[Equation 1]}$$

The second differential amplifier 130 may include a second inversion terminal (−), a second non-inversion terminal (+), a second output terminal $V_o$, and a variable resistor (not illustrated). The second differential amplifier 130 may serve to receive voltages $V_4$ and $V_5$ of both ends of the resistor 110 to the second inversion terminal (−) and the second non-inversion terminal (+), respectively, and output a second output voltage $V_6$ to the second output terminal $V_o$ by amplifying a voltage difference $V_4$-$V_5$ of the both ends of the resistor 110.

In more detail, the second non-inversion terminal (+) is connected with a high voltage terminal $V_4$ of the both ends of the resistor 110, and the second inversion terminal (−) is connected to a low voltage terminal $V_5$ of both ends of the resistor 110 to receive the voltages $V_4$ and $V_5$ applied to both ends of the resistor 110.

Sequentially, the second differential amplifier 130 may output a second output voltage $V_6$ to the second output terminal $V_o$ by amplifying the voltage difference $V_4$-$V_5$ of the voltages $V_4$ and $V_5$ applied to both ends of the resistor 110 inputted to the second inversion terminal (−) and the second non-inversion terminal (+) by a predetermined amplification ratio $G_2$.

Here, the predetermined amplification ratio $G_2$ is a value set by the controller 150 to be described below as a value which varies according to a resistance value of a variable resistor included in the second differential amplifier 130.

The first output voltage $V_6$ amplified through the aforementioned second differential amplifier 130 and outputted to the second output terminal $V_o$ is as the following Equation 2.

$$V_6 = G_2(V_4 - V_5) \quad \text{[Equation 2]}$$

The comparator 140 may serve to receive the first and second output voltages $V_3$ and $V_6$ from the first and second differential amplifiers 120 and 130 to compare levels between the first and second output voltages $V_3$ and $V_6$ and transmit a compared result to the controller 150 and the calculator 160 to be described below.

In more detail, the comparator 140 may compare the levels between voltages input to the first and second input terminals (+, −) based on the voltage input from the second input terminal (−) and output a signal according to the compared result to a third output terminal $V_o$.

As illustrated in FIG. 3, the first input terminal (+) of the comparator 140 is connected with the first output terminal $V_o$ of the first differential amplifier 120 to receive the first output voltage $V_3$, and the second input terminal (−) of the comparator 140 is connected with the second output terminal $V_o$ of the second differential amplifier 130 to receive the second output voltage $V_6$.

Subsequently, the comparator 140 may compare levels between the first and the second output voltages based on the second output voltage $V_6$ input from the second input terminal (−), output a switch deterioration signal to the third output terminal $V_o$ when the first output voltage is more than the second output voltage, and output an output voltage same signal when the first output voltage and the second output voltage are the same as each other to the third output terminal $V_o$.

Here, the switch deterioration signal may be an electric signal which notifies that the turn-on resistance value $R_s$ of the switch 300 is more than the threshold value and thus the deterioration phenomenon of the switch 300 deviates from a normal range. Further, the output voltage same signal may be an electric signal which notifies that the turn-on resistance value $R_s$ of the switch 300 is the same as the threshold value.

In an exemplary embodiment, the switch deterioration signal output from the comparator 140 may be a positive (+) voltage signal, the output voltage same signal may be a voltage signal of 0 V, and a negative (−) voltage signal may be output when the first output voltage is less than the second output voltage as a compared result of the comparator 140.

A correlation of the resistance value $R_r$ of the resistor 110, the turn-on resistance value $R_s$ of the switch 300, and the compared result of the comparator 140 will be described in detail through the controller 150 to be described below.

The controller 150 may serve to determine whether the switch 300 deteriorates based on the compared result of the comparator 140.

As illustrated in FIG. 3, since the battery 200, the switch 300, and the resistor 110 are serially connected to each other, a voltage $V_1-V_2$ applied to both ends of the switch 300 and a voltage $V_4-V_5$ applied to both ends of the resistor 110 are proportional to the turn-on resistance value $R_s$ of the switch 300 and the resistance value $R_r$ of the resistor 110, respectively. Further, when the amplification ratios $G_1$ and $G_2$ of the first and second differential amplifiers 120 and 130 are the same as each other, the first and second output voltages $V_3$ and $V_6$ are equally proportional to the turn-on resistance value $R_s$ of the switch 300 and the resistance value $R_r$ of the resistor 110, respectively.

Accordingly, when the amplification ratios $G_1$ and $G_2$ of the first and second differential amplifiers 120 and 130 are equally controlled by the controller 150 and the switch deterioration signal is output from the comparator 140 of the switch detection device 100 in which the resistance value $R_r$ of the resistor 110 is controlled as the threshold value of the turn-on resistance value $R_s$ of the switch 300, the controller 150 may determine that the switch 300 deteriorates when the turn-on resistance value $R_s$ of the switch 300 is more than the threshold value.

Further, in another exemplary embodiment, the controller 150 may serve to determine whether the switch 300 deteriorates by comparing whether the first output voltage $V_3$ is more than the predetermined voltage value without controlling the amplification ratios $G_1$ and $G_2$ of the first and second differential amplifiers 120 and 130.

In more detail, the controller 150 sets the predetermined voltage value as a threshold value determining whether the switch 300 deteriorates to compare the first output voltage $V_3$ and the predetermined voltage value. As the compared result, when the first output voltage $V_3$ is more than the predetermined voltage value, the controller 150 may determine that the switch 300 deteriorates.

Meanwhile, the controller 150 may serve to control at least one of the resistance value $R_r$ of the resistor 110, the amplification ratio $G_1$ of the first differential amplifier 120, and the amplification ratio $G_2$ of the second differential amplifiers 130 so that the output voltage same signal is output from the comparator 140, in order to calculate the turn-on resistance value $R_s$ of the switch 300 in the calculator 160.

The calculator 160 may serve to calculate the turn-on resistance value $R_s$ of the switch 300 by using the resistance value $R_r$ of the resistor 110 and the amplification ratios $G_1$ and $G_2$ of the first and second amplifiers when receiving the output voltage same signal from the comparator 140.

In more detail, when the controller 150 controls at least one of the resistance value $R_r$ of the resistor 110, the amplification ratio $G_1$ of the first differential amplifier 120, and the amplification ratio $G_2$ of the second differential amplifiers 130 so that the output voltage same signal is output from the comparator 140, an equivalent relationship between the first and second output voltages $V_3$ and $V_6$ output from the first and second differential amplifiers 120 and 130 may be established like the following Equation 3.

$$V_3 = G_1(V_1-V_2) = G_2(V_4-V_5) = V_6$$ [Equation 3]

Further, when a current I flows into a circuit in which the battery 200, the switch 300, and the resistor 110 are serially connected to each other, like the following Equation 4, the voltage difference $V_1-V_2$ between both ends of the switch 300 is a value obtained by multiplying the current I by the turn-on resistance value $R_s$ of the switch 300, and the voltage difference $V_4-V_5$ between both ends of the resistor 110 may be a value obtained by multiplying the current I by the resistance value $R_r$ of the resistor 110, and the currents I at both sides may be eliminated.

$$V_3 = G_1(I \times R_s) = G_2(I \times R_r) = V_6$$ [Equation 4]

Accordingly, the calculator 160 may calculate the turn-on resistance value $R_s$ of the switch 300 through the following Equation 5 by receiving the resistance value $R_r$ of the resistor 110 and the amplification ratios $G_1$ and $G_2$ of the first and second differential amplifiers 120 and 130 from the controller 150, when receiving the output voltage same signal.

$$R_s = \frac{R_r \times G_2}{G_1}$$ [Equation 5]

FIG. 4 is a flowchart illustrating a sequence of determining deterioration of a switch by the switch deterioration detection device according to the exemplary embodiment of the present invention.

Referring to FIG. 4, first, the switch is turned on and then the current flows into the circuit in which the switch, the batter, and the resistor are serially connected to each other, and the voltages are applied to the switch and the resistor, respectively, in proportion to the turn-on resistance value of the switch and the resistance value of the resistor.

The voltage applied to both ends of the switch is input to the first differential amplifier and the voltage applied to the both ends of the resistor is input to the second differential amplifier (S401).

The first differential amplifier amplifies the voltage difference between both ends of the switch with the amplification ratio of the first differential amplifier to output the amplified voltage difference as the first output voltage, and the second differential amplifier amplifies the voltage difference between both ends of the resistor with the amplification ratio of the second differential amplifier to output the amplified voltage difference as the second output voltage (S402).

The comparator receives the first and second output voltages output from the first and second differential amplifiers to compare the levels of the received first and second output voltages (S403), and when the first output voltage is not more than the second output voltage, the process returns to step S401 (S404).

When the first output voltage is more than the second output voltage, the comparator transmits the switch deterioration signal to the controller (S405), and the controller determines that the switch deteriorates when the switch deterioration signal is received from the comparator (S406).

Thereafter, the controller turns off the switch to interrupt the power in order to prevent fire due to the deterioration phenomenon of the switch and a fire in the battery system.

FIG. 5 is a flowchart illustrating a sequence of calculating and detecting a turn-on resistance value of the switch by the device of detecting switch deterioration according to the exemplary embodiment of the present invention. Referring to FIG. 4, first, the switch is turned on and then the current flows into the circuit in which the switch, the battery, and the resistor are serially connected to each other, and the voltages are applied to the switch and the resistor, respectively, in proportion to the turn-on resistance value of the switch and the resistance value of the resistor.

The voltage applied to both ends of the switch is input to the first differential amplifier and the voltage applied to the both ends of the resistor is input to the second differential amplifier (S501).

The first differential amplifier amplifies the voltage difference between both ends of the switch with the amplification ratio of the first differential amplifier to output the amplified voltage difference as the first output voltage, and the second differential amplifier amplifies the voltage difference between both ends of the resistor with the amplification ratio of the second differential amplifier to output the amplified voltage difference as the second output voltage (S502).

The comparator receives the first and second output voltages output from the first and second differential amplifiers to compare the levels thereof (S503), and when the first output voltage is not the same as the second output voltage, the comparator does not transmit the signal to the controller, and the controller controls at least one of the resistance value of the resistor and the amplification ratios of the first and second differential amplifiers until receiving the output voltage same signal from the comparator (S505). Thereafter, the process returns to step S501 (S505).

When the first output voltage and the second output voltage are the same as each other, the comparator transmits the output voltage same signal to the controller and the calculator (S506), and the calculator receives the resistance value of the resistor and the amplification ratios of the first and second differential amplifiers from the controller when receiving the output voltage same signal from the comparator and calculates the turn-on resistance value of the switch by using the aforementioned Equation 5 (S507).

As such, the switch deterioration detection device according to the exemplary embodiment of the present invention may calculate the turn-on resistance value of the switch without being influenced by a change in ambient temperature of the switch and measuring a current value of the current flowing in the switch.

The present invention has been described with reference to the preferred embodiments. However, it will be appreciated by those skilled in the art that various modifications and changes of the present invention can be made without departing from the spirit and the scope of the present invention which are defined in the appended claims and their equivalents.

The invention claimed is:

1. A switch deterioration detection device comprising:
a resistor serially connected with a battery in which charge and discharge are controlled through a switch;
a first differential amplifier configured to amplify a voltage difference between both ends of the switch to output the amplified voltage difference as a first output voltage;
a second differential amplifier configured to amplify a voltage difference between both ends of the resistor to output the amplified voltage difference as a second output voltage;
a comparator configured to compare levels between the second and second output voltages; and
a controller configured to determine whether the switch deteriorates based on the compared result of the comparator.

2. The switch deterioration detection device of claim 1, wherein the comparator outputs a switch deterioration signal when the first output voltage is more than the second output voltage as a result of comparing the levels between the first and second output voltages.

3. The switch deterioration detection device of claim 2, wherein the controller determines that the switch deteriorates when receiving the switch deterioration signal.

4. The switch deterioration detection device of claim 2, wherein the comparator outputs an output voltage same signal when the first output voltage is the same as the second output voltage as a result of comparing the levels between the first and second output voltages.

5. The switch deterioration detection device of claim 4, wherein the controller controls at least one of a resistance value of the resistor and amplification ratios of the first and second differential amplifiers so that the output voltage same signal is output from the comparator.

6. The switch deterioration detection device of claim 5, further comprising:
a calculator configured to calculate a turn-on resistance value of the switch by using the resistance value of the resistor and the amplification ratios of the first and second differential amplifiers when the output voltage same signal is output from the comparator.

7. The switch deterioration detection device of claim 6, wherein the calculator calculates the turn-on resistance value of the switch by using the following Equation:

$$\frac{R_r \times G_2}{G_1} \qquad \text{[Equation]}$$

Here, Rs=turn-on resistance value of switch,
Rr=resistance value of resistor,
$G_1$=amplification ratio of first differential amplifier when the comparator outputs the output voltage same signal, and
$G_2$=amplification ratio of second differential amplifier when the comparator outputs the output voltage same signal.

8. A switch deterioration detection method comprising:
providing a resistor which is serially connected with a battery in which charge and discharge are controlled, by a switch;
amplifying a voltage difference between both ends of the switch to output the amplified voltage difference as a first output voltage, by a first differential amplifier;
amplifying a voltage difference between both ends of the resistor to output the amplified voltage difference as a second output voltage, by a second differential amplifier;
comparing levels between the first and second output voltages, by a comparator; and
determining whether the switch deteriorates based on the compared result of the comparator, by a controller.

9. The switch deterioration detection method of claim 8, further comprising:
outputting a switch deterioration signal when the first output voltage is more than the second output voltage as a result of comparing the levels between the first and second output voltages, by the comparator.

10. The switch deterioration detection method of claim 9, further comprising:
   determining that the switch deteriorates when the controller receives the switch deterioration signal.

11. The switch deterioration detection method of claim 8, further comprising:
   outputting an output voltage same signal when the first output voltage is the same as the second output voltage as a result of comparing the levels between the first and second output voltages, by the comparator.

12. The switch deterioration detection method of claim 11, further comprising:
   controlling at least one of a resistance value of the resistor and amplification ratios of the first and second differential amplifiers, by the controller so that the output voltage same signal is output from the comparator.

13. The switch deterioration detection method of claim 12, further comprising:
   calculating a turn-on resistance value of the switch by using the resistance value of the resistor and the amplification ratios of the first and second differential amplifiers, by the calculator, when the output voltage same signal is output from the comparator.

14. The switch deterioration detection method of claim 13, wherein the calculator calculates the turn-on resistance value of the switch by using the following Equation:

$$\frac{R_r \times G_2}{G_1} \quad \text{[Equation]}$$

Here, Rs=turn-on resistance value of switch,
Rr=resistance value of resistor,
$G_1$=amplification ratio of first differential amplifier when the comparator outputs the output voltage same signal, and
$G_2$=amplification ratio of second differential amplifier when the comparator outputs the output voltage same signal.

* * * * *